United States Patent [19]
Albert, Jr.

[11] 3,972,262
[45] Aug. 3, 1976

[54] PRINTED CIRCUIT BOARD SUPPORT

[75] Inventor: Eugene V. Albert, Jr., Overland Park, Kans.

[73] Assignee: Q Corporation, Overland Park, Kans.

[22] Filed: Dec. 26, 1974

[21] Appl. No.: 536,638

[52] U.S. Cl. .................... 90/19; 51/110; 83/404; 90/21 R; 226/162; 226/168
[51] Int. Cl.² ........................ B23C 1/08
[58] Field of Search ............... 90/18, 19, 21 R; 51/74 R, 78, 110, 112; 198/202, 230; 29/124, 127; 104/89, 94; 83/404, 409, 420, 444, 449, 471, 666; 271/267, DIG. 9; 226/158, 162, 168

[56] References Cited
UNITED STATES PATENTS

| | | |
|---|---|---|
| 970,228 | 9/1910 | Horlacher et al. ............ 198/230 X |
| 1,576,450 | 3/1926 | Nielsen ........................ 29/124 |
| 2,662,350 | 12/1953 | Laverdisse .................... 51/112 X |
| 2,690,034 | 9/1954 | Laverdisse .................... 51/112 |
| 2,803,279 | 8/1957 | Strand ......................... 83/420 X |
| 3,103,085 | 9/1963 | Davis et al. ................... 51/112 |

Primary Examiner—Othell M. Simpson
Assistant Examiner—Fred A. Silverberg
Attorney, Agent, or Firm—Fishburn, Gold & Litman

[57] ABSTRACT

A printed circuit board support as such board is moved through processing operations and including a defined path having guide ways receiving side portions of a carrier for a board being processed and a plurality of fibrous members such as rotatable brushes with the bristles of a stiffness engaging the board to support same at a desired level during processing such as cutting of depending leads to a final length.

6 Claims, 4 Drawing Figures

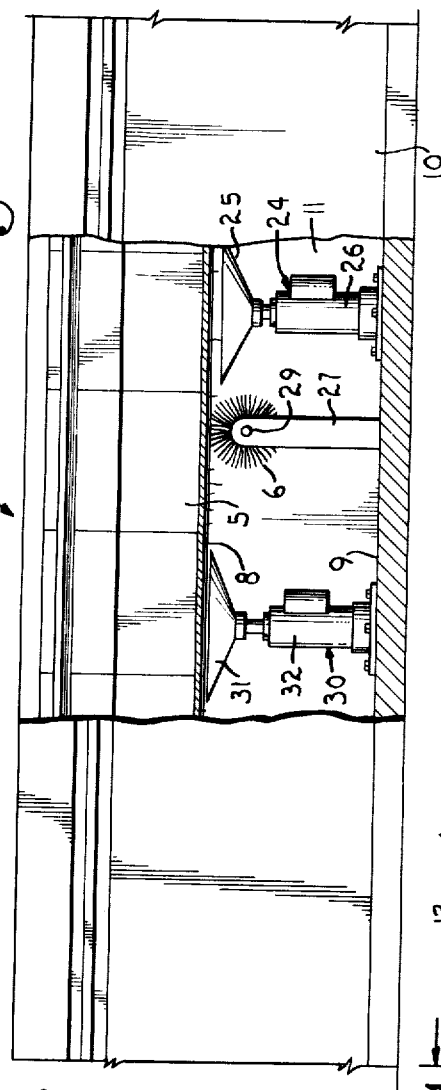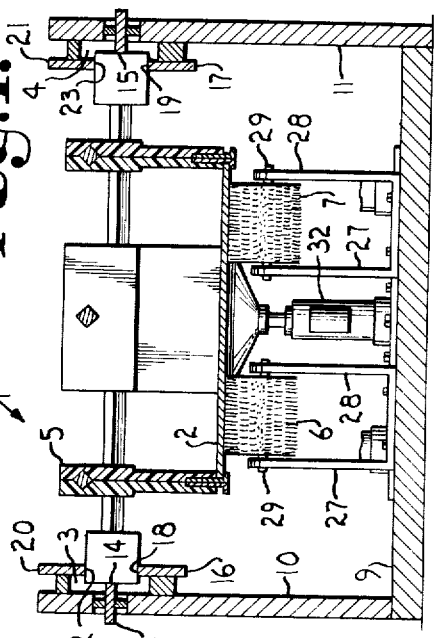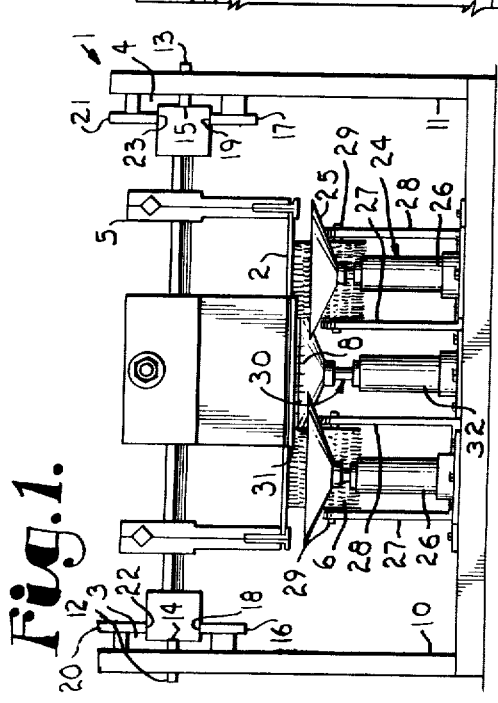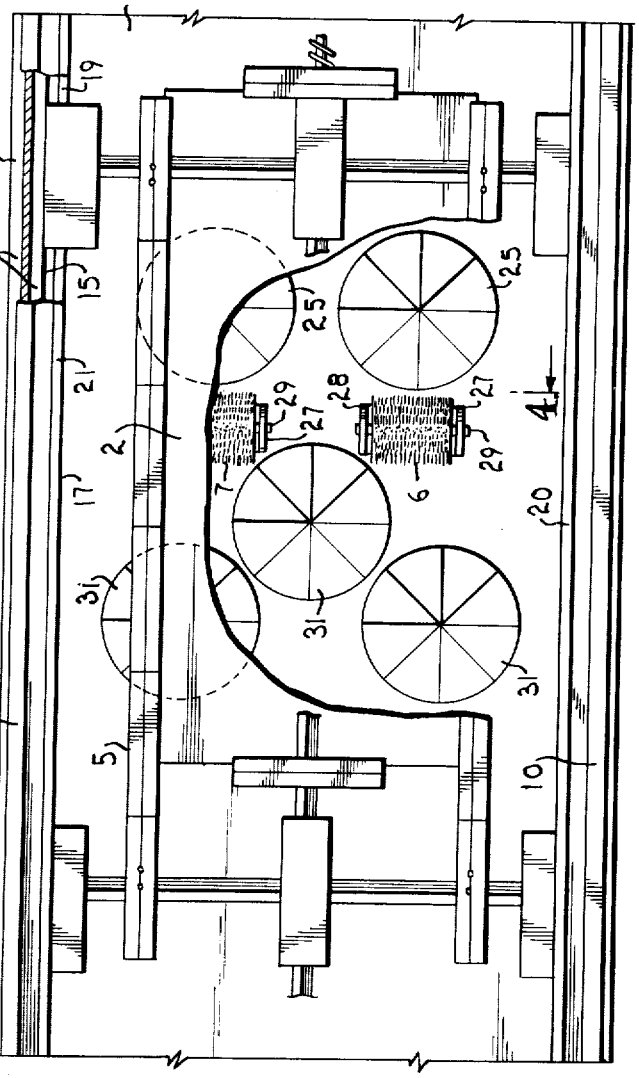

PRINTED CIRCUIT BOARD SUPPORT

The present invention relates to processing of printed circuit boards and more particularly to a support to maintain the board in a planar relation during processing such as cutting of depending leads to a final length.

The principal objects of the present invention are: to provide for processing printed circuit boards and having members defining guide ways adapted to receive a carrier and circuit board therein and maintain same in a defined path during processing such as cutting leads depending from the circuit boards; to provide for processing circuit boards wherein the guide ways have members positioned to limit lateral movement of the carrier and have members positioned to limit vertical movement of the carrier; to provide a support for such board consisting of rotatably mounted brushes with the bristles thereof each having their free ends in supporting engagement with the printed circuit board to hold same in a planar relation with proper spacing from cutters whereby the leads are cut to a final selected length; to provide such a support wherein the bristles of the brushes are sufficiently flexible to permit leads to pass therebetween and through the brush yet have sufficient strength to support the circuit board in the desired position; to provide such a system including first cutters for cutting leads to a first predetermined length and second cutters to cut the leads to a shorter and final length; and to provide such a system for processing printed circuit boards which is durable in construction, economical to manufacture, positive in operation, and particularly well adapted for the proposed use.

Other objects and advantages of this invention will become apparent from the following description taken in connection with the accompanying drawings wherein are set forth by way of illustration and example certain embodiments of this invention.

The drawings constitute a part of the specification and include an exemplary embodiment of the present invention and illustrate various objects and features of the station for processing printed circuit boards.

FIG. 1 is an end elevational view of a support for processing printed circuit boards, said support embodying features of the present invention.

FIG. 2 is a side elevational view of the support with portions broken away to better show the component parts.

FIG. 3 is a top plan view of the support.

FIG. 4 is a transverse sectional view through the support and taken on line 4—4, FIG. 3.

Referring more in detail to the drawings:

As required, detailed embodiments of the present invention are disclosed herein, however, it is to be understood that the disclosed embodiments are merely exemplary of the invention which may be embodied in various forms. Therefore specific structural and functional details disclosed herein are not to be interpreted as limiting but merely as a basis for the claims and as a representative basis for teaching one skilled in the art to variously employ the present invention in virtually any appropriately detailed structure.

In the disclosed embodiment of the present invention, the reference numeral 1 designates generally a station for processing printed circuit boards 2. The station 1 includes members defining laterally spaced guide ways 3 and 4 which receive therein side portions of each of a plurality of carriers 5 supporting therein a respective printed circuit board 2 to thereby maintain same and the circuit board 2 in a defined path during movement through the processing operation. A plurality of members 6 and 7 are mounted at the station 1 and each have fibrous members or the like in supporting engagement with the circuit board 2 during the processing step such as cutting of depending leads 8 to a final length.

The station 1 may be for any processing step and in the illustrated system includes a frame having a base 9 mounted on a suitable supporting surface, such as a floor. The illustrated frame 9 includes a pair of substantially parallel and laterally spaced side walls 10 and 11 mounted on the base 9 and extending upwardly therefrom. The side walls 10 and 11 support members defining the guide ways 3 and 4 respectively. The guide ways are effective to maintain a carrier 5 and a printed circuit board 2 therein in a defined path during movement thereof through the frame and station 1.

Laterally opposed and longitudinally extending guide bars 12 and 13 are mounted on the side walls 10 and 11 respectively. The guide bars 12 and 13 have facing surfaces 14 and 15 respectively positioned at a selected lateral spacing and adapted to be slidingly or otherwise engaged by respective side or supporting members or surfaces of the carrier 5.

Laterally spaced and substantially parallel support bars 16 and 17 extend longitudinally along the side walls 10 and 11 respectively. The support bars 16 and 17 are positioned below the guide bars 12 and 13 respectively. The support bars 16 and 17 are positioned toward the center of the station 1 and have upwardly facing surfaces 18 and 19 positioned at a selected elevation and each are adapted to be slidingly engaged by respective downwardly facing surfaces of the carrier 5.

Laterally spaced upper bars 20 and 21 are positioned above and substantially vertically aligned with the support bars 16 and 17. The upper bars 20 and 21 extend longitudinally along the side walls 10 and 11 of the station 1 and have downwardly facing surfaces 22 and 23 respectively which are positioned in facing relation with the upwardly facing surfaces 18 and 19 of the support bars 16 and 17. The downwardly facing surfaces 22 and 23 of the upper bars 20 and 21 are each adapted to be slidingly engaged by respective upper surfaces of the carrier 1.

The guide bars 12 and 13, support bars 16 and 17, and the upper bars 20 and 21 cooperate to substantially restrict movement of the carrier 5 and the printed circuit board 2 therein whereby movement of the carrier 5 is along the defined path with a lower surface of the printed circuit board 2 positioned at a selected elevation. If the circuit board is warped or sags or is not in planar condition, inaccurate cutting of leads or other processing may occur. The support members 6 and 7 are to eliminate test difficulty.

In the structure illustrated one or more precutters 24 are positioned adjacent and downstream from an entrance to the station 1. Each of the precutters 24 has rotatably mounted blades 25 driven by a suitable drive motor 26 mounted on the base 9. The cutting edges of the blades 25 are positioned at a selected spacing below a selected plane for the lower surface of the printed circuit board 2 thereby defining a first selected length of the leads 8 depending from the lower surface of the printed circuit board 2.

Some printed circuit boards do warp or bend when in the carrier 5. The station 1 includes means mounted on the frame and positioned adjacent and downstream from the precutters 24 for supporting and positioning a center portion of the printed circuit board 2 at a selected elevation during movement of the carrier 5 and the printed circuit board 2 therein through the station 1.

In the illustrated embodiment, the members 6 and 7 are laterally spaced rotary mounted brushes and each have the longitudinal axis thereof extending transverse of the longitudinal axis of the station 1. The brushes 6 and 7 are each mounted on a respective pair of laterally spaced standards 27 and 28 extending upwardly from the base 9. The standards 27 and 28 are positioned downstream from the precutters 24 and support an axle 29 extending therebetween. The brushes 6 and 7 each include a body portion having a plurality of longitudinally and circumferentially spaced bristles extending therefrom to define a rotatably mounted member.

The bristles each have a free end thereof engaging a lower surface of the printed circuit board 2 for supporting same. Movement of the printed circuit board 2 through the station 1 effects rotation of the brushes 6 and 7 thereby moving different bristles into engagement with the lower surface of the circuit board 2 as same is moved through the station 1.

The bristles for the brushes 6 and 7 will bend or shift slightly to permit the leads 8 to pass therebetween and through the respective brushes and yet have sufficient strength and stiffness to support the circuit board 2 in the desired position. Nylon and plastic bristles have been found to be suitable for this purpose.

A plurality of final cutters 30 are positioned adjacent and downstream from the brushes 6 and 7 and are similar in construction and operation to the precutters 24. The illustrated final cutters 30 each have rotatably mounted blades 31 driven by a suitable motor 32 mounted on the base 9. The top of the blades 31 is at a selected spacing below the predetermined lower planar position for the lower surface of the circuit board 2 and is closer thereto than the blades 25 whereby the final cutters 30 are operative to cut the leads to a second and shorter length.

The brushes 6 and 7 and the guideways 3 and 4 cooperate to position the lower surface of each printed circuit board 2 moved through the station 1 at a selected spacing above the blades 32 of the final cutters 30 whereby only a selected amount of the leads 8 remain after movement by the final cutters 30.

It is to be understood that while I have illustrated and described one form of my invention it is not to be limited to the specific form or arrangement of parts herein described and shown.

What I claim and desire to secure by Letters Patent is:

1. Apparatus for processing of a printed circuit board comprising:
   a. a frame having laterally spaced and longitudinally extending side members;
   means on each of said frame side members for maintaining a printed circuit board carrier and the circuit board therein in a defined path during movement thereof through said frame, said means comprising:
      1. a pair of laterally opposed and longitudinally extending guide bars, said guide bars having facing surfaces positioned at a selected spacing apart and adapted to be slidingly engaged by respective side surfaces of the carrier;
      2. a pair of laterally spaced and longitudinally extending support bars each having an upwardly facing surface positioned at a selected elevation and adapted to be slidingly engaged by respective downwardly facing surfaces of the carrier;
      3. a pair of laterally spaced and longitudinally extending upper bars each having a downwardly facing surface positioned in facing relation with the upwardly facing surface of a respective one of said support bars, the downwardly facing surfaces of said upper bars each being adapted to be slidingly engaged by respective upper surfaces of the carrier;
   c. first cutting means mounted on said frame and positioned along the defined path for cutting leads depending from the printed circuit board to a first length;
   d. means mounted on said frame and positioned adjacent said first cutting means for supporting and positioning the printed circuit board at a selected elevation during movement of the carrier and printed circuit board through said frame, said circuit board supporting means being adapted to permit the leads to pass therethrough; and
   e. second cutting means mounted on said frame and positioned adjacent said means for supporting the printed circuit board for cutting leads depending from the printed circuit board to a second and shorter length.

2. Apparatus for processing a printed circuit board as set forth in claim 1 wherein said circuit board supporting means comprises:
   a. a pair of laterally spaced brushes each having a longitudinal dimension thereof extending transverse to the defined path of movement of the printed circuit board, the longitudinal axis of each of said brushes being aligned one with the other, said brushes each having a plurality of bristles circumferentially spaced around the periphery thereof, said bristles each having a free end thereof positioned to be in supporting engagement with the printed circuit board; and
   b. means on said frame for rotatably mounting each of said brushes whereby movement of the printed circuit board along the defined path effects rotation of said brushes.

3. Apparatus for processing a printed circuit board as set forth in claim 1 wherein said circuit board supporting means includes a plurality of bristles each having a free end thereof positioned to be in supporting engagement with the printed circuit board, said bristles being arranged in at least one brush having a longitudinal dimension thereof extending transverse to the defined path of movement of the printed circuit boards.

4. Apparatus for processing a printed circuit board as set forth in claim 3 wherein said brush is rotatably mounted on said frame and has said bristles circumferentially spaced around the periphery thereof whereby movement of the printed circuit board along the defined path effects rotation of said brush.

5. Apparatus for processing of a printed circuit board, said apparatus comprising:
   a. a frame having laterally spaced and longitudinally extending members defining a guide way for maintaining a printed circuit board carrier and the circuit board therein in a defined path during movement thereof through said frame, said members defining said guide way includes:

1. a pair of laterally opposed and longitudinally extending guide bars, said guide bars having facing surfaces positioned at a selected spacing apart and adapted to be slidingly engaged by respective side surfaces of the carrier;
2. a pair of laterally spaced and longitudinally extending support bars each having an upwardly facing surface positioned at a selected elevation and adapted to be slidingly engaged by respective downwardly facing surfaces of the carrier; and
3. a pair of laterally spaced and longitudinally extending upper bars each having a downwardly facing surface positioned in facing relation with the upwardly facing surface of a respective one of said support bars, the downwardly facing surfaces of said upper bars each being adapted to be slidingly engaged by respective upper surfaces of the carrier;

b. first cutting means mounted on said frame and positioned along the defined path for cutting leads depending from the printed circuit board to a first length;

c. means mounted on said frame and including a plurality of bristles positioned adjacent said first cutting means for supporting and positioning the printed circuit board at a selected elevation during movement thereof through said frame, said bristles being adapted to permit the leads to pass therebetween;

d. said plurality of bristles are arranged in a pair of laterally spaced brushes each having a longitudinal dimension thereof extending transverse to the defined path of movement of the printed circuit board, the longitudinal axis of each of said brushes being aligned one with the other, said brushes each having a free end thereof positioned to be in supporting engagement with the printed circuit board;

e. said frame has means thereon for rotatably mounting each of said brushes whereby movement of the printed circuit board along the defined path effects rotation of said brushes; and f. second cutting means mounted on said frame and positioned adjacent said plurality of bristles for cutting leads depending from the printed circuit board to a second and shorter length.

6. Apparatus for processing a printed circuit board comprising:

a. a frame having laterally spaced and longitudinally extending side members;

b. laterally spaced guides on said frame at a selective spacing for supporting engagement with respective side portions of a printed circuit board carrier for maintaining said carrier and the printed circuit board therein in a defined path movement thereof along said frame;

c. first cutting means mounted on said frame and positioned along the defined path for cutting leads depending from the printed circuit board to a first length;

d. means mounted on the frame and positioned adjacent said first cutting means for cooperating with said guides for supporting and positioning the printed circuit board at a selected elevation relative to said first cutting means and including a plurality of laterally spaced brushes each having a longitudinal dimension thereof extending transverse to the defined path of movement of the printed circuit board, said brushes each having a plurality of bristles circumferentially spaced around the periphery thereof, said bristles each having a free end thereof positioned for engagement with the printed circuit board for supporting same at said selected elevation as it is moved thereover, said bristles of said brushes being adapted to bend slightly to permit leads depending from the printed circuit board to pass between the brush bristles;

e. means on said frame for rotatably mounting each of said brushes for free rotation whereby engagement of the free ends of the bristles with the printed circuit board as it is moved along the defined path effects rotation of said brushes; and f. second cutting means mounted on said frame and positioned adjacent said spaced brushes for cutting leads depending from the printed circuit board to a second and shorter length.

* * * * *